United States Patent
Doan et al.

(10) Patent No.: US 10,964,851 B2
(45) Date of Patent: Mar. 30, 2021

(54) SINGLE LIGHT EMITTING DIODE (LED) STRUCTURE

(71) Applicant: SemiLEDs Optoelectronics Co., Ltd., Chu-nan (TW)

(72) Inventors: Trung Tri Doan, Baoshan Township, Hsinchu County (TW); David Trung Doan, Baoshan Township, Hsinchu County (TW)

(73) Assignee: SemiLEDs Optoelectronics Co., Ltd., Chu-nan (TW)

( * ) Notice: Subject to any disclaimer, the term of this patent is extended or adjusted under 35 U.S.C. 154(b) by 156 days.

(21) Appl. No.: 16/114,377

(22) Filed: Aug. 28, 2018

(65) Prior Publication Data
US 2019/0067529 A1   Feb. 28, 2019

Related U.S. Application Data

(60) Provisional application No. 62/551,859, filed on Aug. 30, 2017.

(51) Int. Cl.
| | |
|---|---|
| *H01L 33/50* | (2010.01) |
| *H01L 33/10* | (2010.01) |
| *H01L 27/15* | (2006.01) |
| *H01L 25/075* | (2006.01) |
| *H01L 33/40* | (2010.01) |
| *H01L 33/08* | (2010.01) |
| *H01L 33/38* | (2010.01) |

(52) U.S. Cl.
CPC ............ *H01L 33/50* (2013.01); *H01L 27/153* (2013.01); *H01L 33/10* (2013.01); *H01L 33/504* (2013.01); *H01L 25/0753* (2013.01); *H01L 33/08* (2013.01); *H01L 33/382* (2013.01); *H01L 33/405* (2013.01)

(58) Field of Classification Search
None
See application file for complete search history.

(56) References Cited

U.S. PATENT DOCUMENTS

| 9,318,529 B2 * | 4/2016 | Jang ................... H01L 27/153 |
| 10,388,690 B2 * | 8/2019 | Jang ................... H01L 27/153 |
| 2002/0155634 A1 * | 10/2002 | D'Evelyn ............ H01L 31/108 438/48 |

(Continued)

*Primary Examiner* — Lex H Malsawma
(74) *Attorney, Agent, or Firm* — Stephen A. Gratton

(57) ABSTRACT

A single light emitting diode (LED) structure includes an array of spaced discrete light emitting zones separated by isolation areas. Each emitting zone includes an epitaxial structure configured to emit an emitting light having a particular wavelength over an effective emission area. In addition, the effective emission area for each emitting zone can be geometrically defined and electrically configured to provide a desired light intensity. For example, each effective emission area can have a selected size and spacing depending on the application and light intensity requirements. Each emitting zone also includes a wavelength conversion member on its effective emission area configured to convert an emitting wavelength of the emitting light to a different color. The single (LED) structure can include multiple colors at different zones to produce a desired spectra or design. The single (LED) structure can also include a substrate for supporting the array, and the substrate can include one or more light shielding holes located between each emitting zone.

18 Claims, 19 Drawing Sheets

(56) References Cited

U.S. PATENT DOCUMENTS

| | | | |
|---|---|---|---|
| 2007/0158659 A1* | 7/2007 | Bensce | H01L 31/11 |
| | | | 257/79 |
| 2010/0302775 A1* | 12/2010 | Hata | H01L 25/0753 |
| | | | 362/231 |
| 2015/0280086 A1* | 10/2015 | Jang | H01L 33/405 |
| | | | 257/88 |
| 2016/0133612 A1* | 5/2016 | Windisch | H01L 25/0753 |
| | | | 257/76 |
| 2017/0025484 A1* | 1/2017 | Forrest | H01L 51/56 |
| 2017/0294417 A1* | 10/2017 | Edmond | H01L 33/502 |
| 2018/0187839 A1* | 7/2018 | Vampola | F21K 9/20 |

* cited by examiner

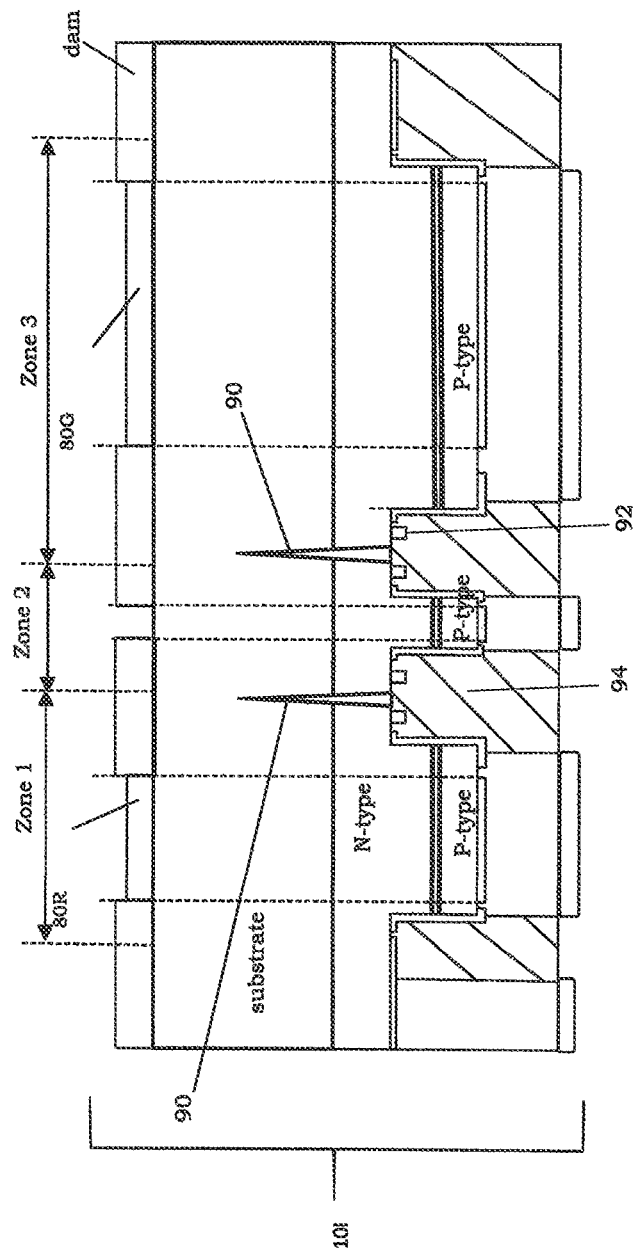

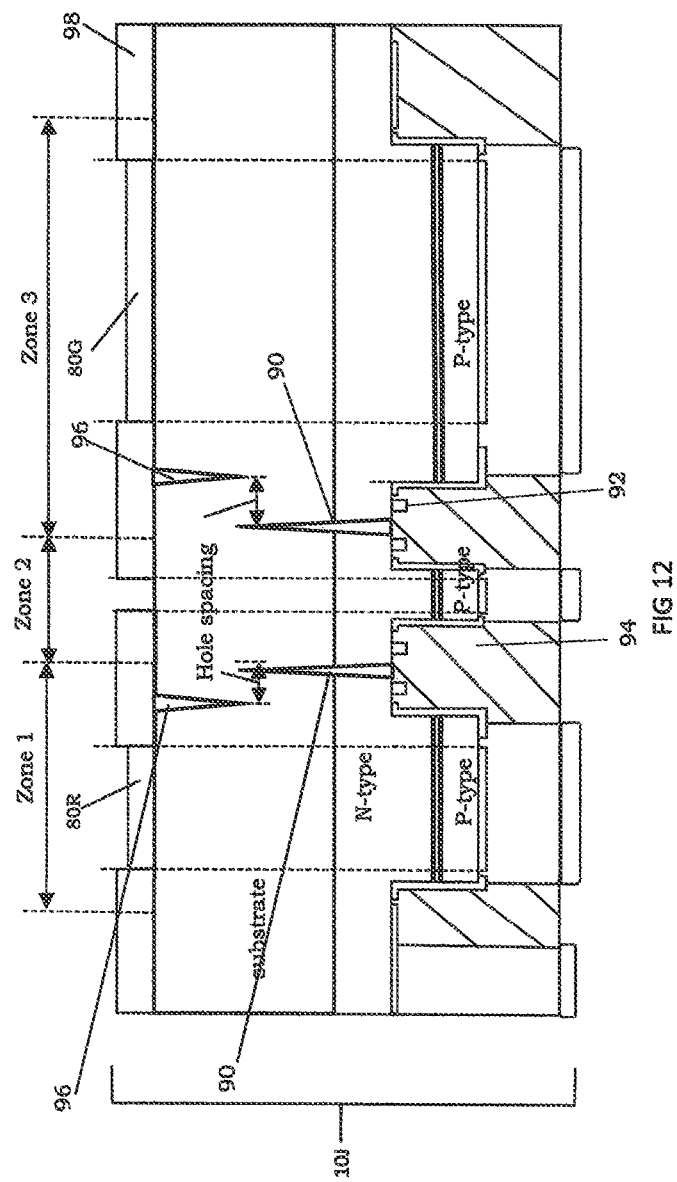

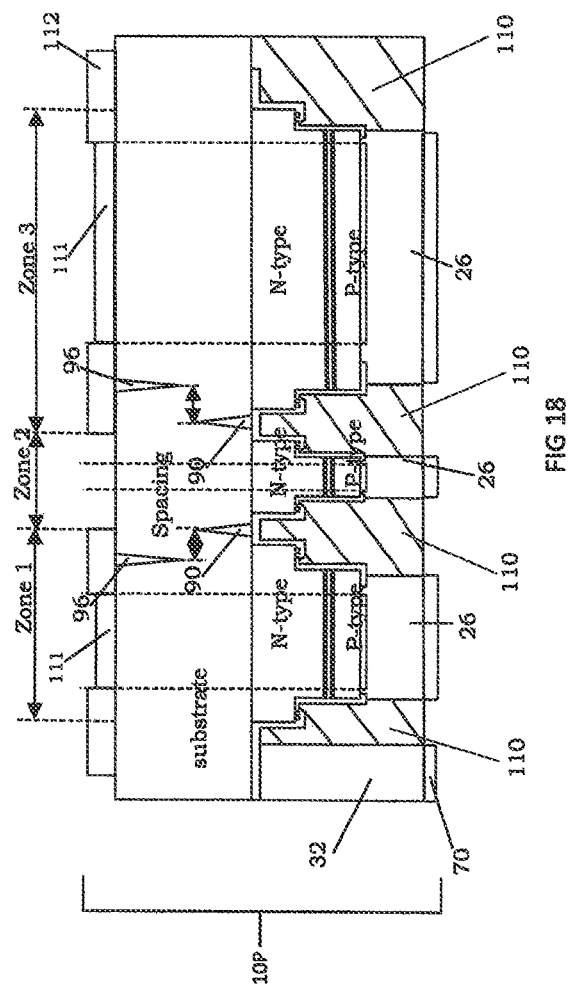

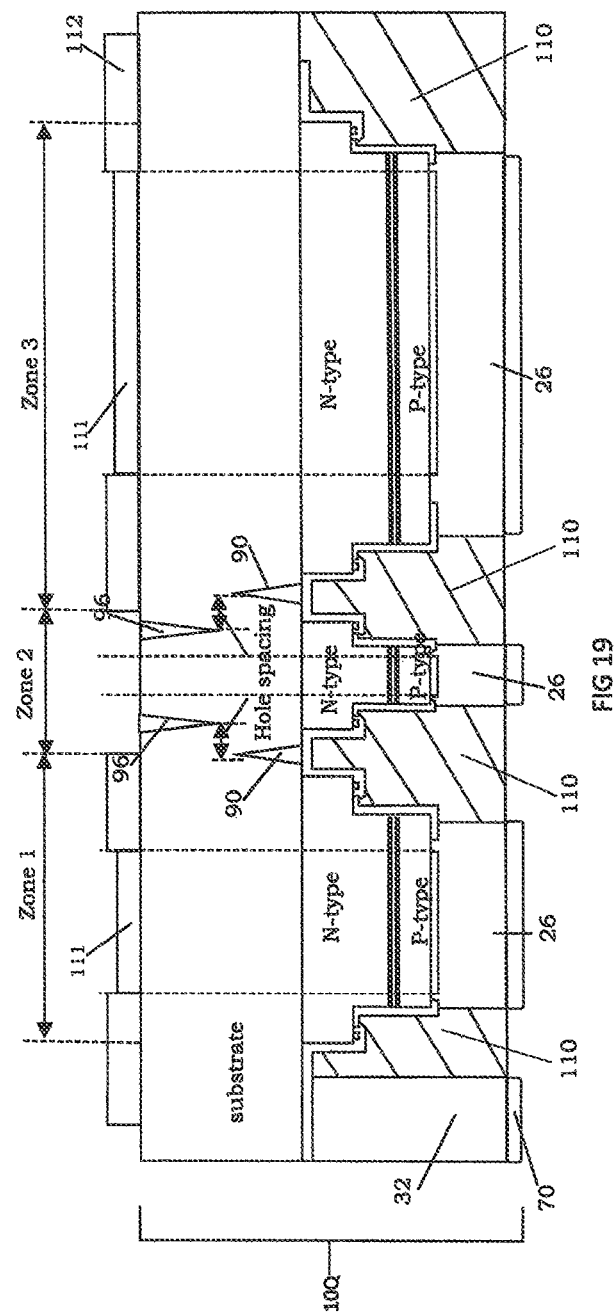

SINGLE LIGHT EMITTING DIODE (LED) STRUCTURE

CROSS REFERENCE TO RELATED APPLICATIONS

This application claims priority from U.S. Provisional No. 62/551,859, filed Aug. 30, 2017, which is incorporated herein by reference.

BACKGROUND

This disclosure relates to single light emitting diode structures configured to emit more than one color. These types of light emitting diode (LED) structures can include multiple controllable emitting areas, which are controlled to have a desired amount of emitting light exiting from each emitting areas. By selective incorporation of color converter members, the emitting areas can be configured to emit different colors thus producing a desired color spectra.

Indoor and outdoor LED displays are also being constructed using fine-pitch LED packaging technology. For example, surface-mounted-device (SMD) LEDs and chip-scale-package (CSP) LEDs have been used as fine-pitch LED packages for making LED displays. LED displays are also moving towards more pixel volumes and pixel densities. The pitch requirements are also advancing from 1010 on average to less than 0606. LED packages with smaller pitches are expected to see surging growth in the near future. In these LED packages, a pure and clean emission pixel for a display is a fundamental requirement for displaying a high definition image.

The prior art discloses multiple LEDs having various colors packaged together to produce a desired spectra of light. This disclosure is directed to a single light emitting diode LED structure having multiple controllable emitting zones that can be converted to a different color using color converters to produce a desired light spectra. In addition, the single light emitting diode LED structure can be operated with reduced light crosstalk making a packaging process for the LED structure simple and low cost.

SUMMARY

A single light emitting diode (LED) structure includes an array of spaced discrete light emitting zones, each of which comprises an epitaxial structure configured to emit an emitting light having particular wavelength over an effective emission area. The effective emission area for each emitting zone can be geometrically defined and electrically configured to provide a desired light intensity and color for the emitting light. In addition, geometry of the emitting zones and effective emission areas can be defined during fabrication to reduce a light crosstalk effect. The light crosstalk effect can be further reduced by fabricating a shielding hole in the substrate, which is located between each emitting zone.

In an illustrative embodiment, a single light emitting diode (LED) structure includes a substrate such as a plurality of controllable emitting zones on the substrate including a Zone 1, a Zone 2, a Zone 3 and Zone n. The single light emitting diode (LED) structure can also include one or more wavelength conversion members in selected emission zones for converting the emitting light to a different color to produce a desired color spectrum. The single light emitting diode (LED) structure can be configured to produce red, blue, green, white, warm white on the same chip thus a single LED structure can be configured to emit multiple colors at different zones for a desired spectra or design. In addition, an effective emission area for each emitting zone can be configured to control the light intensity of an emitting color for each emitting zone. To prevent the light cross talk effect between the emitting zones, each emission area can be surrounded by a light shielding wall in the substrate located between each emitting zone. In one embodiment of the single LED structure, the selected wavelength conversion member can be contained in a wall or dam above the area of the particular emission zone. In an alternate embodiment of the single light emitting diode (LED) structure at least a portion of the substrate has been removed.

BRIEF DESCRIPTION OF THE DRAWINGS

FIG. 11 is an enlarged schematic cross section drawing with parts removed of a ninth single light emitting diode (LED) structure;

FIG. 12 is an enlarged schematic cross section drawing with parts removed of a tenth single light emitting diode (LED) structure;

FIG. 18 is an enlarged schematic cross section drawing with parts removed of a sixteenth single light emitting diode (LED) structure; and FIG. 19 is an enlarged schematic cross section drawing with parts removed of a seventeenth single light emitting diode (LED) structure.

DETAILED DESCRIPTION

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
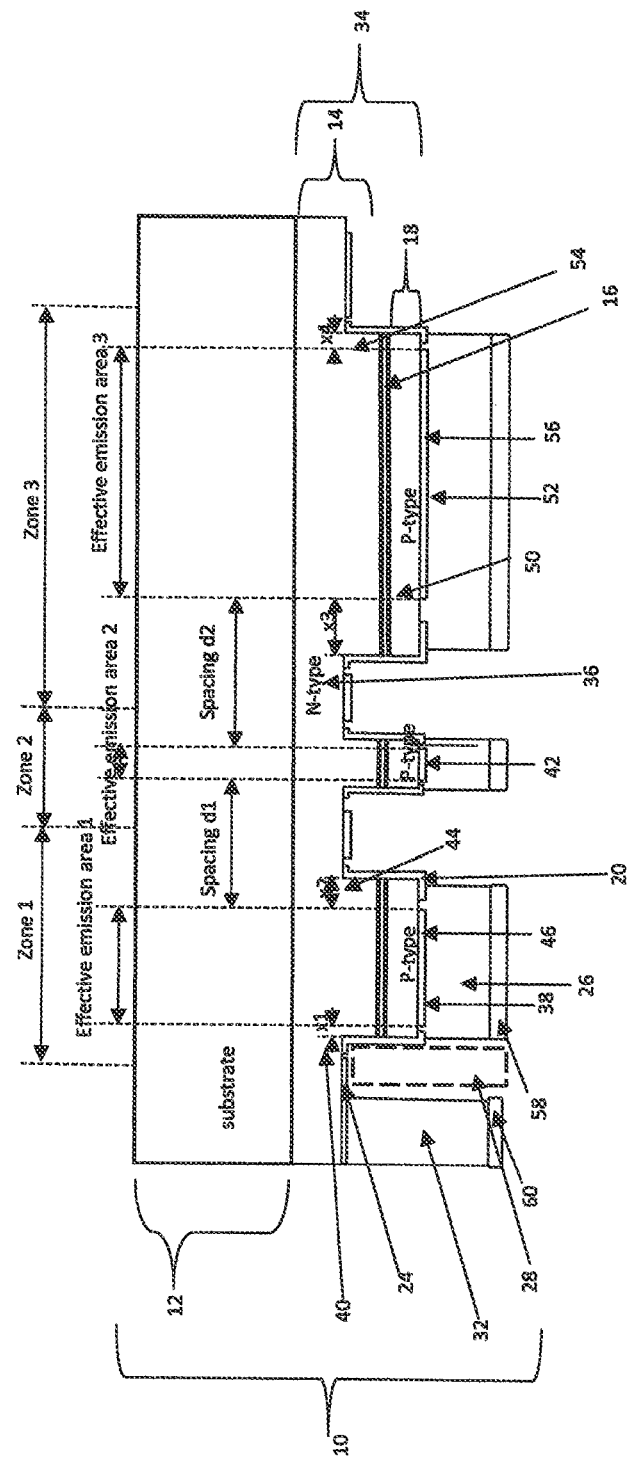
FIG. 1 is an enlarged schematic cross section drawing with parts removed of a single light emitting diode (LED) structure.

Referring to FIG. 1, a single light emitting diode (LED) structure 10 is illustrated. As used herein the term "single" refers to a chip. The light emitting diode (LED) structure 10 includes a substrate 12, an n-type layer 14, an active layer 16, a p-type layer 18, a reflective metal layer 22, an n-type contact metal layer 24, a P-metal electrode layer 26, an isolation area 28 containing an isolation layer 20, and an N metal electrode layer 32. (Also note that the formation of the N metal electrode layer 32 is not limited to the one shown in FIG. 1. Alternately it can be constructed as multiple N metal electrode layers located on n-type contact metal layers).

The single light emitting diode (LED) structure 10 is configured as a direct bandgap compound semiconductor light emitting diode (LED) formed using semiconductor fabrication processes. For example, a LED epitaxial structure 34 can be grown on the substrate 12 using semiconductor processes that include the initial growth of an epitaxy layer (e.g., the n-type layer 14, such as a Si doped GaN layer), the active layer 16 (e.g. multiple quantum wells), and the p-type layer 18 (e.g. Mg doped GaN layer). In addition, the epitaxial structure 34 (FIG. 1) can be formed of a direct bandgap compound semiconductor light emitting diode material grown on a substrate. The emitting wavelength of semiconductor light can be determined by the energy bandgap of direct bandgap semiconductor compound. Different direct energy bandgap of the semiconductor light emitting material can be selected from III-V compound semiconductors such as $In_xGa_{1-x}N$, GaN, $Al_xGa_{1-x}N$, $In_xGa_{1-x}As$, InGaP, GaAs, GaAsP, InP, $(Al_xGa_{1-x})_yIn_{1-y}P$, GaP. The substrate 12 (FIG. 1) can comprise a transparent material, such as a sapphire substrate, a bulk GaN substrate, and an MN bulk substrate.

Still referring to FIG. 1, the single light emitting diode (LED) structure 10 includes multiple emission zones (Zone 1, Zone 2, Zone 3), which are closely spaced, discreet, controllable, light emission zones configured to emit a particular wavelength range of light. For example, Zone 1 can be configured as a green emission zone and can be located proximate to a left side of the single light emitting diode (LED) structure 10. Zone 2 can be configured as a blue emission zone and can be located in a middle portion of the single light emitting diode (LED) structure 10. Zone 3 can be configured as a red emission zone and can be located proximate to an opposing right side of the single light emitting diode (LED) structure 10. It is to be understood that these locations for the various emission zones (Zone 1, Zone 2, Zone 3) in FIG. 1 are merely exemplary, and the single light emitting diode (LED) structure 10 can be configured to have multiple emission zones on the same substrate. There is no limit to the number of zones and as many as needed for the desired spectra can be employed.

Still referring to FIG. 1, each emission zone can have a selected size depending on the application. Each emission zone can have a same area, or alternately a different area based on different light intensity requirements. The size of each area can be different so that one can optimize the optical outputs of each zone to the desired optical output for a desired input current. A non-active region 36 can be formed between the zones, to define a specific area for each zone in the single light emitting diode (LED) structure 10. In addition, a portion of the n-type layer 14 can be exposed in each non-active region 36. Further, an n-type contact metal layer 24 can be exposed on a portion of the n-type layer 14 to provide low resistance electrical connections. Still further, the n-type contact metal layer 24 can be connected and formed as a finger shape or a mesh shape, on a portion of the exposed n-type layer 14 in the single light emitting diode (LED) structure 10 to provide improved current spreading for the individual sub-pixel light emitting units formed by each zone. In one embodiment, there could be multiple n-type contact metal layers 24 so that the current can evenly flow to various zones.

Still referring to FIG. 1, in each zone, a portion of the active layer 16 and a portion of the n-type layer 14 can be etched to expose the n-type layer 14. As also shown on the left of FIG. 1, the isolation area 28 can also contain an isolation material 20. The etched edge profile of the isolation area 28 can comprise a straight profile, an undercut profile (inverted trapezoidal) or a positive trapezoid profile. In addition, the etched profile can comprise an oblique structure configured to confine the light in each zone (Zone 1, Zone 2, Zone 3). The defined p-type layer 18, active layer 16, and n-type layer 14 in Zone 1 functions as a discrete light-emitting unit. Further, the isolation layer 20 can be formed on a portion of the p-type layer 18, on the edge of the etched sidewall, and on a portion of the etched exposed n-type layer 14. In addition, the reflective layer 22 can be formed on a portion of the p-type layer 18 to provide good electrical properties while at the same time functioning as a reflector configured to reflect the light emitted from the active layer 16 to enhance the light outputs.

As also shown on the left of FIG. 1, a distance X1 can be measured between a left-hand side reflective metal layer 38 and a left-hand side effective emission edge 40 for Zone 1. A distance X2 can measured between a right-hand side reflective metal layer 42 and a right-hand side effective emission edge 44 for Zone 1 and the left side of Zone 2. The distance X2 can be larger than that of X1. Also note that the effective emission area 1 can also be defined by an effective contact area 46 of the reflective metal layer 22 on the p-type layer 18. The purpose of the unbalanced position of the reflective metal layer 22 on the p-type layer 18 is to provide a selected space (d1) for Zone 1 relative to Zone 2. The spacing (d1) can be selected to provide no light emission over a portion of Zone 1 thus reducing the scattering of light from Zone 1 escaping to Zone 2. For the same purpose, Zone 2 emission light has enough space (d1) such that no light emitting from Zone 2 scatters into Zone 1. Also note that the effective emission area 1 is in part defined by the effective contact area 46 of the reflective metal layer 22 on the p-type layer 18. In another embodiment, the effective emission area 1 can be defined by the location of an isolation layer (not shown). In this case, a portion of the isolation layer (not shown) can be designed on the p-type layer 18 to expose a portion of p-type layer 18 for the reflective metal layer 22 deposition. Also note that the reflective metal layer 22 in this embodiment can be formed on the exposed p-type layer and on the isolation layer (not shown). The effective emission area 1 can also be restricted by an isolation layer (not shown) on the p-type layer 18. In this case, the reflective metal layer 22 can be deposited on a portion of the p-type layer 18 and an isolation layer (not shown). The current would be blocked by the isolation layer (not shown) on the p-type layer 18. Zone 2 can be configured to emit a blue color. For a white balance-displaying image, the blue emission light intensity can be selected as a small ratio. Thus, each zone functions as a discreet LED unit designed for the smallest emission area relative to an area of the reflective metal layer 22. Similarly, effective emission area 2 can be designed by the effective size of the reflective metal layer 22 on the p-type layer 18. Effective emission area 2 can also be designed by an open region of an isolation layer (not shown) exposed on the p-type layer 18.

For Zone 3 also note that the distance between a right-hand side reflective metal layer 48 (right-hand with respect to Zone 2) and a right-hand side effective emission edge 50 (right-hand with respect to Zone 2) is X3, and the distance between a right-hand side reflective metal layer 52 (right-hand with respect to Zone 3) and a right-hand side effective emission edge 54 (right-hand with respect to Zone 3) is x4. The distance of x3 is larger than that of the x4. Also note that the effective emission area 3 is defined by an effective contact area 56 of the reflective metal layer 22 on the p-type layer 18. The purpose of the unbalance position of the reflective metal layer 22 on the p-type layer 18 is to provide enough space (spacing d2) far away from Zone 2. With this space (spacing d2) there is no light emission over a portion of Zone 3, which reduces the scattering of light from Zone 3 escaping to Zone 2. Similarly, Zone 2 emission light does not scatter into the Zone 3. Rather than being defined by the effective contact area of the reflective metal layer 22 on the p-type layer 18, the effective emission area can alternately be defined by an isolation layer (not shown). A portion of an isolation layer (not shown) can be designed on the p-type layer 18 to expose a portion of p-type layer 18 for the reflective metal layer deposition. Also note that the reflective metal layer 22 can be formed on the exposed p-type layer and the isolation layer (not shown). An effective emission area 3 can also be restricted by a designed isolation layer (not shown) on the p-type layer 18. In this case, the reflective metal layer 22 can be deposited on a portion of the p-type layer 18 and the isolation layer (not shown), thus blocking current.

The reflective metal layer 22 can comprise a metal selected from the group consisting of Ni, Ag, Au, Pt, TiW, TaN, ITO, Ti, Al, Sb, and alloys thereof. The isolation layer 20, as well as the isolation layers, which are not shown, can comprise a dielectric material selected from the group consisting of $SiO_2$, $SiN_x$, $Al_2O_3$, AlN, $TiO_2$, $Ta_2O_5$, MgO or combinations thereof in multiple layers. In addition, the isolation layer 20 can comprise a distributed Bragg reflective (DBR) layer to provide a sidewall reflective DBR layer to reflect the light back to the functional LED region and prevent light escaping to the adjacent zones. The isolation layer 20 can also comprise a transparent organic or inorganic material or a non-transparent organic or inorganic material such as epoxy, gel, silicone, parylene, polyimide, and BCB. For a transparent organic or inorganic material, the refractive index can be larger than the air, and the light scattering from the effective active layer can have a larger total reflective angle to reflect more light back to the functional LED region and not scatter light to its adjacent zone. For a non-transparent organic or inorganic material, the light from the effective active layer can also be absorbed and not scattered to its adjacent zones.

The P-metal electrode layers 26 can be formed on the reflective metal layer 22 and a portion of an isolation layer to enhance each function LED unit structure. As shown on the left-hand side of FIG. 1, the single light emitting diode (LED) structure 10, can include the n-type contact metal layer 24. This contact metal layer can be formed in the same step by depositing the metal layers through different technologies such as plasma enhanced vapor deposition, chemical vapor deposition, e-beam vaporization metal deposition, thermal deposition, sputter deposition, electroplating, electro-less chemical plating etcetera. In the single light emitting diode (LED) structure 10, multiple independent controllable emission areas are provided (effective emission area 1, effective emission area 2, effective emission area 3). In addition, each emission area has a different surface area, with at least one area being less than the others.

A P-connecting layer 58 can optionally be formed on the P-metal electrode layers 26. Similarly, an n-connecting layer 60 can be formed on the N metal electrode layers 32.

FIGS. 2-19 illustrate different embodiments of the single light emitting diode (LED) structure 10 (FIG. 1). These different embodiments illustrate different or additional features, which can be incorporated into the single light emitting diode (LED) structure 10 (FIG. 1) to satisfy a particular lighting application.

Figure 2:
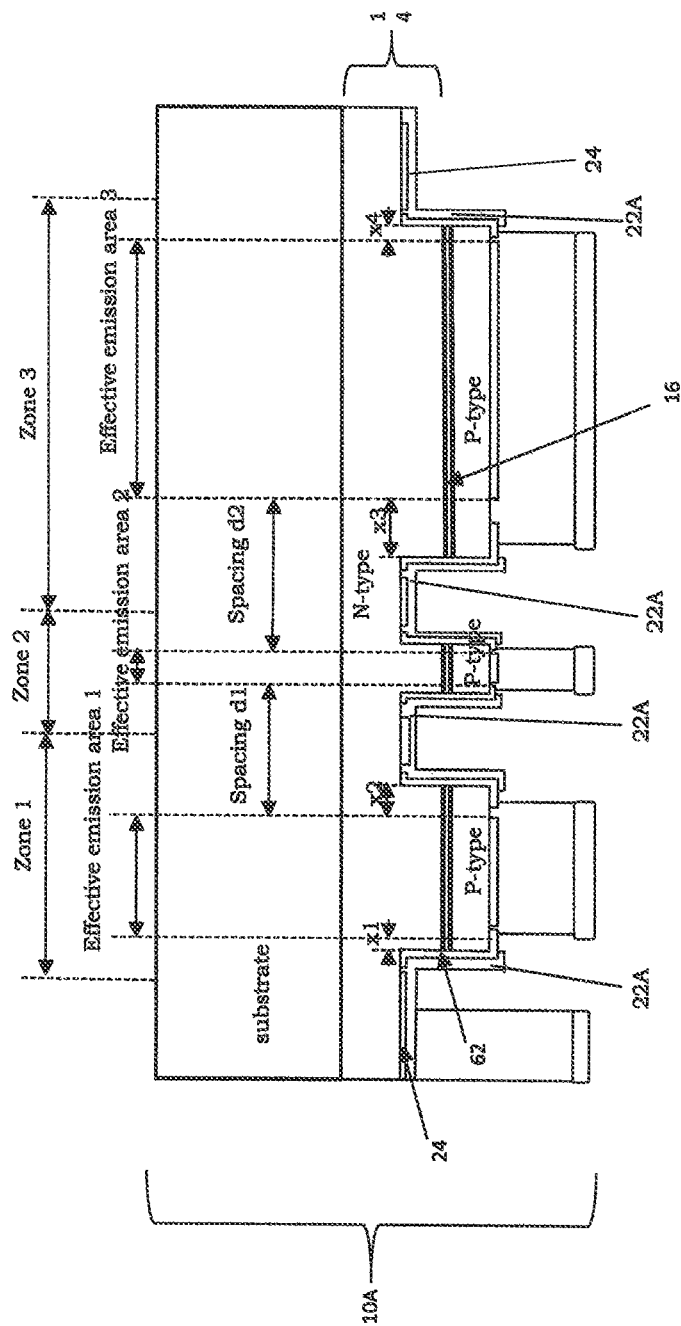
FIG. 2 is an enlarged schematic cross section drawing with parts removed of a second single light emitting diode (LED) structure.

Referring to FIG. 2, a second type of single light emitting diode (LED) structure 10A is illustrated. The second single light emitting diode (LED) structure 10A is substantially the same as the single light emitting diode (LED) 10 shown in FIG. 1. However, an optional reflective metal layer 22A can be formed on a portion of the exposed n-type layer 14, and on the n-type contact metal layer 24. The reflective metal layer 22A can also be formed on the sidewall of an isolation layer 62 to help to reflect light from the active layer 16 and stop the light from escaping to its adjacent zones.

Figure 3:
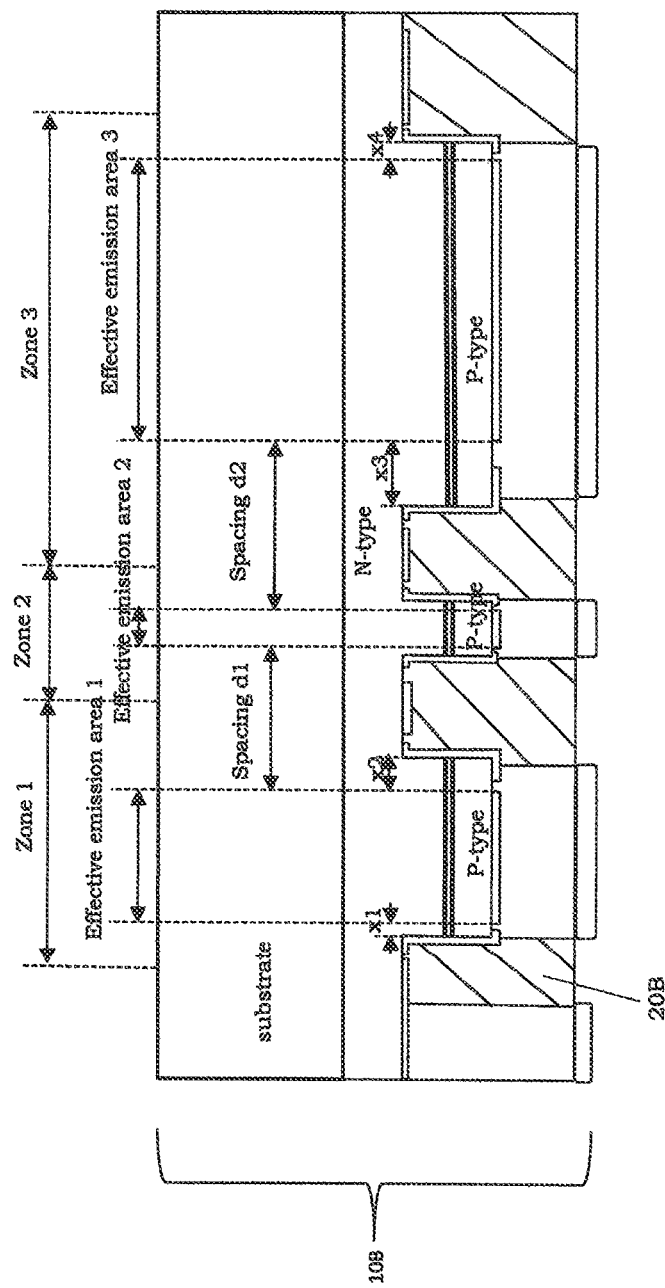
FIG. 3 is an enlarged schematic cross section drawing with parts removed of a third single light emitting diode (LED) structure.

Referring to FIG. 3, a third type of single light emitting diode (LED) structure 10B is illustrated. The third type of single light emitting diode (LED) structure 10B is substantially the same as the single light emitting diode (LED) 10 shown in FIG. 1 but includes an isolation material 20B in the region between the N metal electrode layers 32 (FIG. 1) and the P-metal electrode layers 26 (FIG. 1) and the regions therebetween. In this embodiment, the isolation material 20B increases the single LED structure and fills in the empty spaces between the metal electrodes as well as enhancing the optical output by reflecting stray lights. With reference to FIG. 1, before forming the connecting layers 58, 60, the isolation material 20B (FIG. 3) can be formed through different technologies such as patterning a photo resist, screen printing, fill in, spray in and spin coating. The height of the isolation material 20B (FIG. 3) preferably is not at the same level plane to the P-metal electrode layers 26 or the N metal electrode layers 32. In applications, using an organic or inorganic material, the P-metal electrode layer 26 and the N metal electrode layers 32 can be planarized by any available planarization technique such as polishing, diamond saw head planar scanning and CMP. In this case, the isolation material 20B, the P-metal electrode layers 26, and the N metal electrode layers 32 would all be formed at a substantially same level plane. Alternately, the isolation material 20B can have photosensitive or non-photosensitive properties as well as dyeing by color chemical solutions. In addition, the isolation material 20B can be cured by thermal curing, UV curing, or IR curing. For example, organic or inorganic liquids can be selected to form as hard properties, such as gels, glues, sol-gels, epoxy, silicone, phenyl-silicone; photo-sensitive resister, UV cure able glues, and thermal cure able glues. Further, the isolation material 20B can be selected to form as stretch properties, such as gels, glues, epoxy, polyimide, silicone, methyl-silicone, cohesive gels, silicone gels, PMMA, photosensitive resister, UV or thermal cure able glues. Still further, the isolation material 20B can be mixed with micron or submicron insulators, such as $TiO_2$, $Al_2O_3$, $SiO_2$, sol-gel, or any suitable powder. An organic or inorganic liquid can also be mixed with nano-metals, such as Ni, Cu, Ag, Al and Au.

Figure 4:
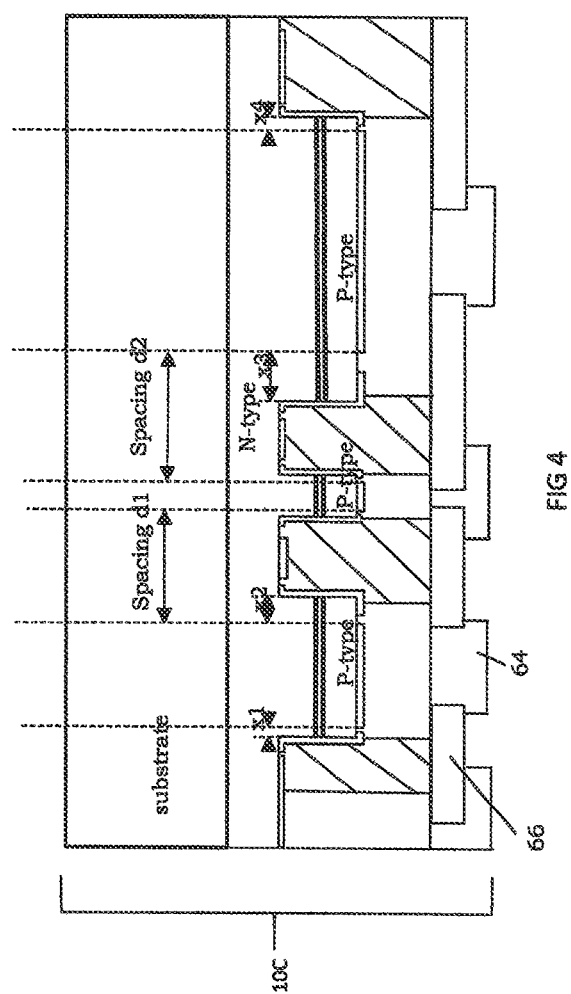
FIG. 4 is an enlarged schematic cross section drawing with parts removed of a fourth single light emitting diode (LED) structure.

Referring to FIG. 4, a fourth type of single light emitting diode (LED) structure 10C is illustrated. Due to the various sizes of the emission zones, the sizes of the various P electrodes 26 and N electrodes 32 are not the same. It is desirable to have similar pad sizes to enhance the SMT of the LED structure 10C to a printed circuit board (PCB) or ceramic circuit board (CCB). The fourth type of single light emitting diode (LED) structure 10C is substantially the same as the single light emitting diode (LED) 10 shown in FIG. 1 but also includes a relocated connecting layer circuit 64 having insulators 66 to provide pads with similar sizes for ease of SMT, die attached or wire bonding. It is also important to make these pads with various shapes such that one could distinguish an N pad relative to a P pad. The insulators 66 can be patterned and designed to form on the substantially same height level plane and as the P-metal electrode layers 26 (FIG. 1) and the N metal electrode layers 32 (FIG. 1). The relocated connecting layer circuit 64 can also be connected to each P-metal electrode layer 26 (FIG. 1) or N metal electrode layer 32 (FIG. 1) to form another designed and patterned connecting layer on a backside of the fourth single light emitting diode (LED) structure 10C. With the relocated connecting layer circuit 64 having pads the single light emitting diode (LED) structure 10C can be mounted using SMT directly on a PCB or CCB.

Figure 5:
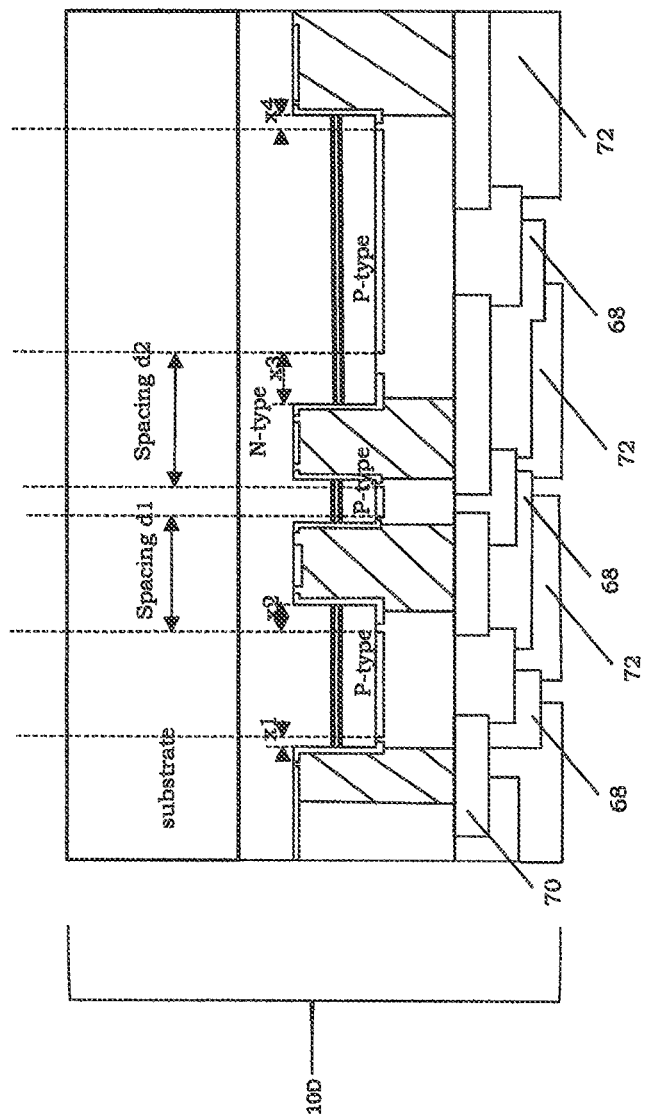
FIG. 5 is an enlarged schematic cross section drawing with parts removed of a fifth single light emitting diode (LED) structure.

Referring to FIG. 5, a fifth type of single light emitting diode (LED) structure 10D is illustrated. The fifth type of single light emitting diode (LED) structure 10D is substantially the same as the single light emitting diode (LED) 10C shown in FIG. 4 but includes additional insulation layers 68 further patterned on the fourth single light emitting diode (LED) structure 10C of FIG. 4. In addition, N connecting layers 70 and P connecting layers 72 can be relocated to the desired area to from additional connecting such as forming common pads for multiple emission zones to reduce the number of pads needed for SMT or for die attaching or wire bonding to a PCB or CCB.

Figure 6:
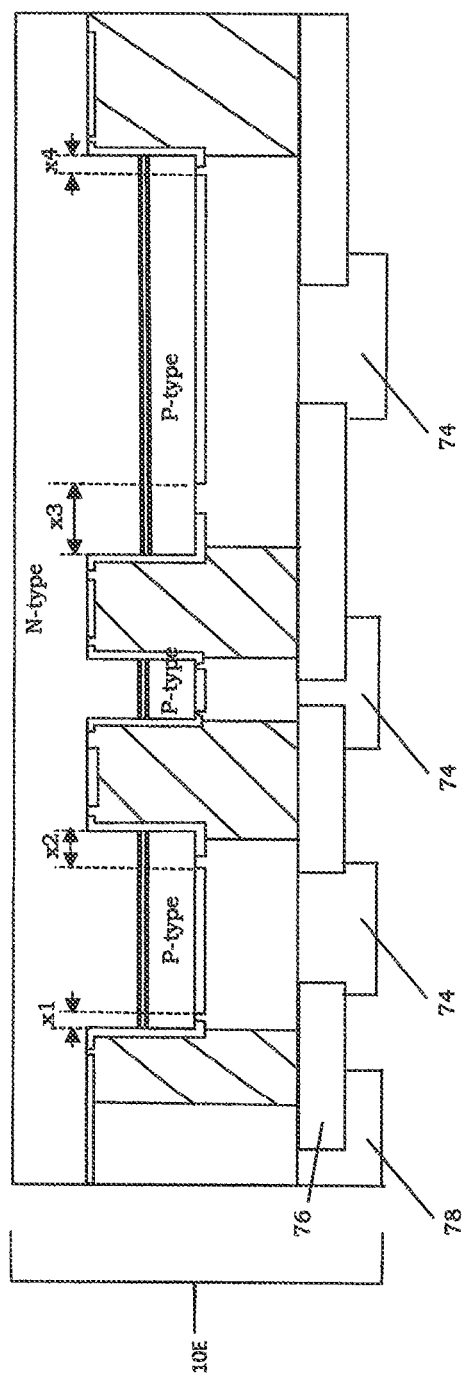
FIG. 6 is an enlarged schematic cross section drawing with parts removed of a sixth single light emitting diode (LED) structure.

Referring to FIG. 6, a sixth type of single light emitting diode (LED) structure 10E is illustrated. The sixth type of single light emitting diode (LED) structure 10E is substantially the same as the single light emitting diode (LED) 10D shown in FIG. 5, but a portion or all of the substrate 12 (FIG. 1) has been removed using a suitable process such as laser irradiated lifting off, chemical wet etching, mechanical lifting off, grinding and chemical mechanical polishing (CMP). In addition, P-connecting layers 74 have been relocated by adding insulation layer 76, 78, opening certain areas and forming additional metal layers. Forming processes for the insulation layers 76, 78, P-connecting layers 74 and N-connecting layers 70 can be repeated to achieve the target locations for each connecting layer.

Figure 7:
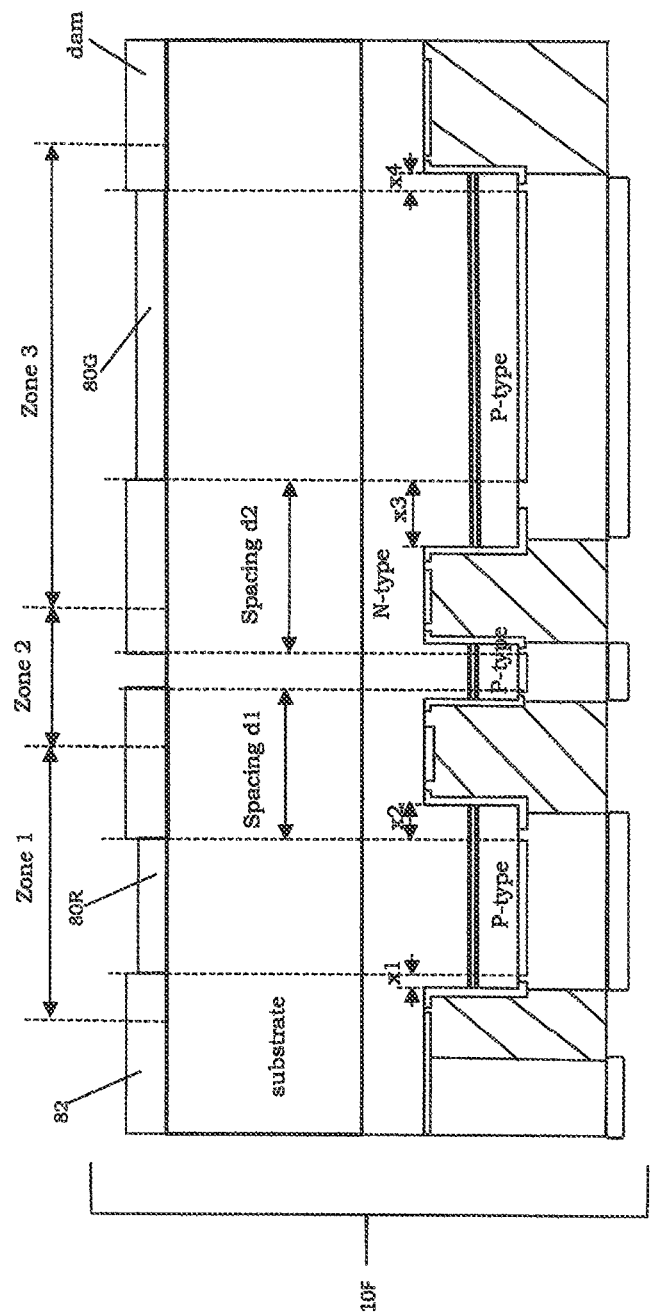
FIG. 7 is an enlarged schematic cross section drawing with parts removed of a seventh single light emitting diode (LED) structure.

Referring to FIG. 7, a seventh type of single light emitting diode (LED) structure 10F having the wavelength conversion; member formed on the top of the substrate 12 is illustrated. The color converter members are surrounded by a dam 82 to prevent stray light from one emission zone to the other zones. The seventh type of single light emitting diode (LED) structure 10F is substantially the same as the single light emitting diode (LED) 10 shown in FIG. 1, but also includes one or more wavelength conversion member configured to change a wavelength of the light emitted from the active areas 16 (FIG. 1) to achieve a desired color spectra. The seventh type of single light emitting diode (LED) structure 10F includes two wavelength conversion members 80R in Zone 1 and 80G in Zone 2, which are formed and insulated on the substrate 12 using an electrically insulating dam 82. In addition, as shown in FIG. 7, the dam 82 can be configured to align the wavelength conversion members 80R, 80G with an effective emission area 84 in each zone. (Alternately the dam 82 can have a different placement than illustrated). The dam 82 can be formed as a black matrix formed on a surface of the substrate 12 and can be configured to define each emission color in the different zones (Zone 1, Zone 2, Zone 3). Further, if the seventh single light emitting diode (LED) structure 10F is constructed with a blue emission LED epitaxial structure 34 (FIG. 1), the initial emitting color is already a blue emission color spectrum, such that a blue color converter is not required in Zone 2. However, for some applications a blue wavelength conversion member (not shown) can be formed in Zone 2 to filter the original blue light for a more consistent and accurate wavelength. In other applications for obtaining a pure and consistent red, blue and green peak wavelength emission light, which considers the color balance for a full color display application, a color filter can be formed in each color zone to assure the same peak wavelength for each emission color. The color filter can comprise a photo resist, or multiple dielectric layers configured as a bandpass filter. For a shorter wavelength emission LED epitaxial structure 34 (FIG. 1) such as a violet or ultraviolet LED, a blue wavelength conversion member (not shown) can be formed in Zone 2. Suitable materials for forming the wavelength conversion members 80R, 80G (as well as the other described wave length conversion members) include phosphor, quantum dots (QDs) and other color conversion material. The wavelength conversion members 80R, 80G can also comprise multiple layers such as a phosphor or quantum dot materials as a first layer and a color filter as the second layer.

Figure 8:
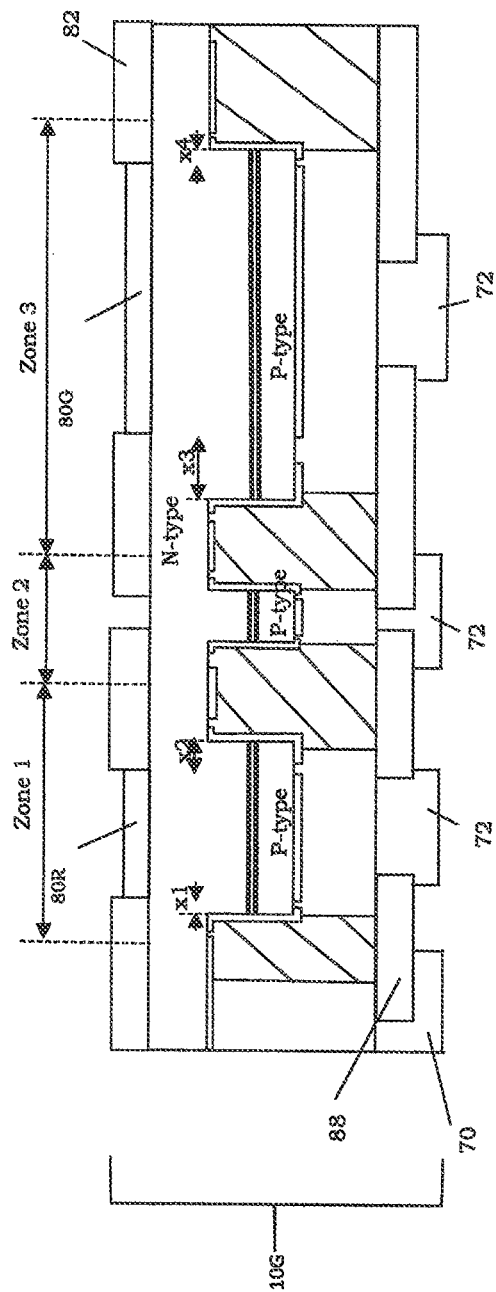
FIG. 8 is an enlarged schematic cross section drawing with parts removed of an eight single light emitting diode (LED) structure.

Referring to FIG. 8, an eighth type of single light emitting diode (LED) structure 10G is illustrated. The eighth type of single light emitting diode (LED) structure 10G is substantially the same as the single light emitting diode (LED) 10F shown in FIG. 7. However, in the eighth type of single light emitting diode (LED) structure 10G either a portion or all of the substrate 12 (FIG. 1). In other embodiments (not shown), the wavelength conversion members can comprise a transparent substrate such as glass, quartz, sapphire, with a wavelength conversion layer thereon. Also, the dam 82 (FIG. 7) can be optionally formed to separate each one of the wavelength conversion members allowing them to be aligned with the zones (Zone 1, Zone 2, Zone 3) to convert the monochrome color of the single light emitting diode (LED) structure 10G to a desired color for each zone.

Figure 9B:
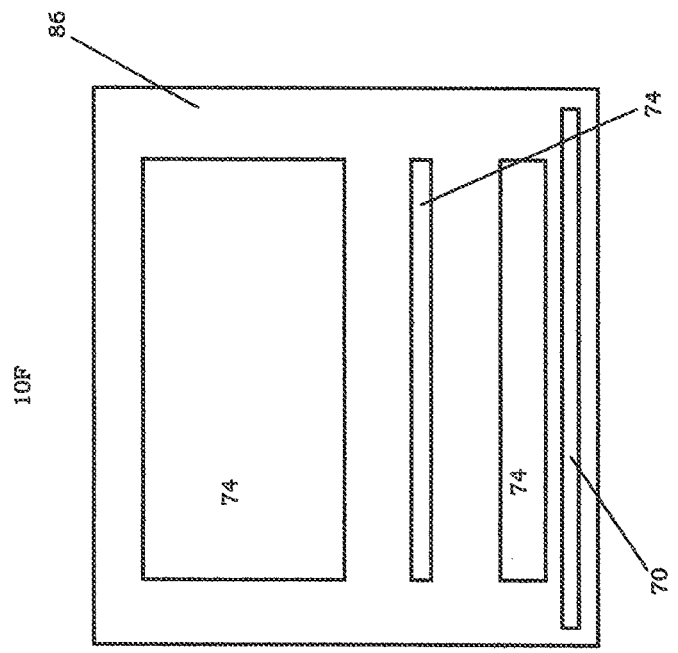
FIG. 9B is bottom view of the seventh single light emitting diode (LED) structure shown in FIG. 7.
Figure 9A:
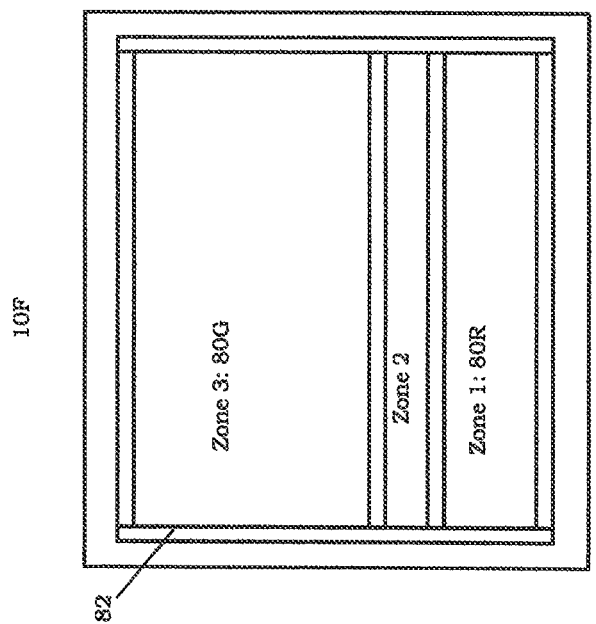
FIG. 9A is top view of the seventh single light emitting diode (LED) structure shown in FIG. 7.

Referring to FIGS. 9A and 9B, a top view and a bottom view of the seventh type of single light emitting diode (LED) structure 10F (FIG. 7) is illustrated. As shown in FIG. 9A, the dam 82 can comprise a sealed dam mesh configured to allow the wavelength conversion members 80R, 80G to be formed and aligned with Zones 1 and 3. The dam 82 can comprise an organic or inorganic material such as epoxy, gel, silicone, polyimide, or any suitable material and could be mixed with micron or submicron insulators, such as $TiO_2$, $Al_2O_3$, $SiO_2$, sol-gel, or any suitable powder to stop the light escaping to the adjacent zones. With a blue emission LED epitaxial structure 34 (FIG. 1), a wavelength conversion member configured as a green converter can be formed in Zone 3, and wavelength conversion member configured as a red color converter can be formed in Zone 1. As shown in FIG. 9B, an isolation material 86 can be conformally formed on the backside. In addition, a n-connecting layer, a p-connecting layer-1, a p-connecting layer-2, and a p-connecting layer-3 can be exposed and located. The connecting layers can comprise an electrically conductive layer such as metal layers or multiple metal layers, such as Ni, Au, Ti, Al, TiW, TaN, Cr, Pd, Cu, In, Sn, Ag and alloys thereof. The alloyed metal can also comprise a eutectic layer such as InAu, SnCu, SnAgCu and SnPb. The connecting layers can also include a bumping metal such as Sn, In, Cu, Ag, Au and alloys thereof.

Figure 10B:
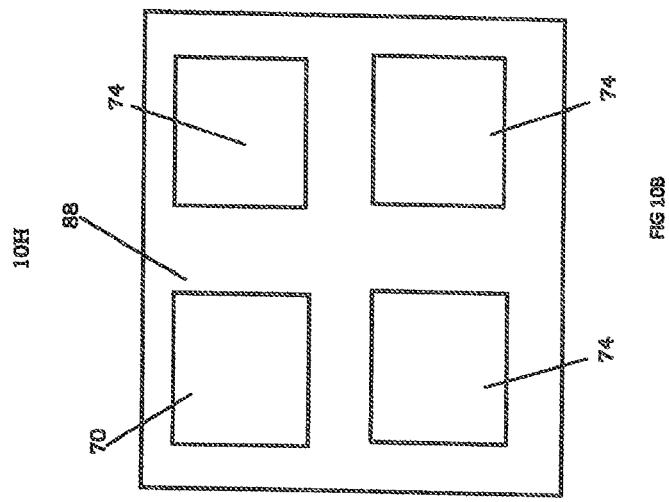
FIG. 10B is bottom view of a single light emitting diode (LED) structure.
Figure 10A:
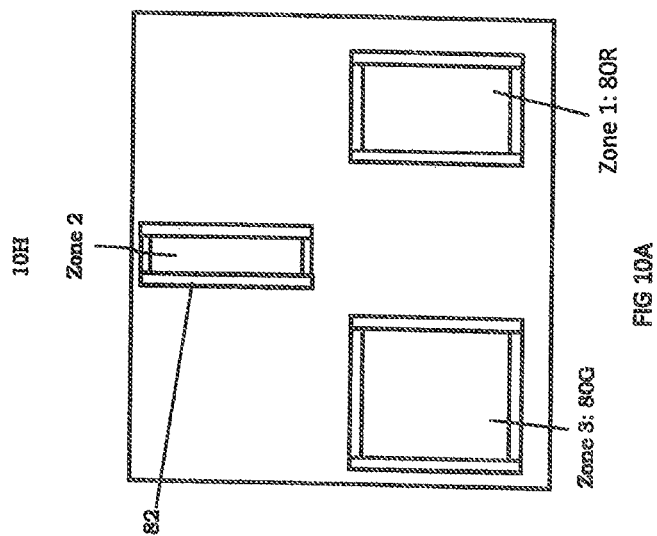
FIG. 10A is top view of a single light emitting diode (LED) structure.

Referring to FIGS. 10A and 10B, a top view and a bottom view of the single light emitting diode (LED) structure equivalent to but different from the previously described top view of FIG. 9A and bottom view of FIG. 9B are illustrated. As shown in FIG. 10A, in this single RGB light emitting diode (LED) structure 10H, Zone 2 is offset with respect to Zones 1 and 3. As shown in FIG. 10B, the n-connecting layer has a polygonal outline, and three P-connecting layers have a polygonal outline defined by an insulating layer 88.

Referring to FIG. 11, a ninth type of single light emitting diode (LED) structure 10I is illustrated. The ninth type of single light emitting diode (LED) structure 10I is substantially the same as the single light emitting diode (LED) 10F shown in FIG. 7, but also includes an oblique light shielding hole 90 in a backside of the substrate 12 configured to provide a light stop structure for preventing the scattering light effect and the optical wave guiding effect in the substrate 12 to enhance optical output. In this embodiment, the oblique light shielding hole 90 can be formed by laser cutting, dry etching, water jet guiding laser cutting, dicing-saw cutting, as well as other suitable processes. For a laser cutting process for forming the oblique light shielding hole 90, the laser can form one or more oblique holes in the substrate 12 with a cutting-edge profile configured to prevent the light from emitting to the adjacent zone. In the ninth type of single light emitting diode (LED) structure 10I, an n-type contact metal 92 can be formed on the n-type layer 14 between Zones 1 and 2 and between Zones 2 and 3. In addition, the n-type contact metal 92 can extend into, or not extend into, the oblique light shielding hole 90 and can either cover or not cover the oblique light shielding hole 90. In the case of not covering in the oblique light shielding hole 90, an isolation material 94 can be formed into the oblique light shielding hole 90 by filling in. The isolation material 94 in the oblique light shielding hole 90 provides a light stop structure to confine the emission light in each zone (Zone 1, Zone 2, Zone 3). Also note that the oblique light shielding hole 90 can be formed from the top of the substrate 12 rather than from the backside of the substrate (not shown).

Referring to FIG. 12, a tenth type of single light emitting diode (LED) structure 10J is illustrated. The tenth type of single light emitting diode (LED) structure 10J is substantially the same as the single light emitting diode (LED) 10I shown in FIG. 11, but includes additional top oblique light shielding holes 96 formed from the top or front side of the substrate 12 to further enhance optical output. In this case, a dam 98 can be formed on a top major surface of the substrate 12 and on the top oblique light shielding holes 96. Also note that the top oblique light shielding holes 96 have a spacing away from the bottom oblique light shielding holes 90. The purpose of the hole spacing is to prevent the substrate 12 from breaking apart by the holes 90, 96. In addition, the top oblique light shielding holes 96 can be formed and located outside of the bottom oblique light shielding holes 90. This provides a double light shielding oblique effect to confine the emitted light in each zone and preventing the scattering of light to adjacent zones.

Figure 13:
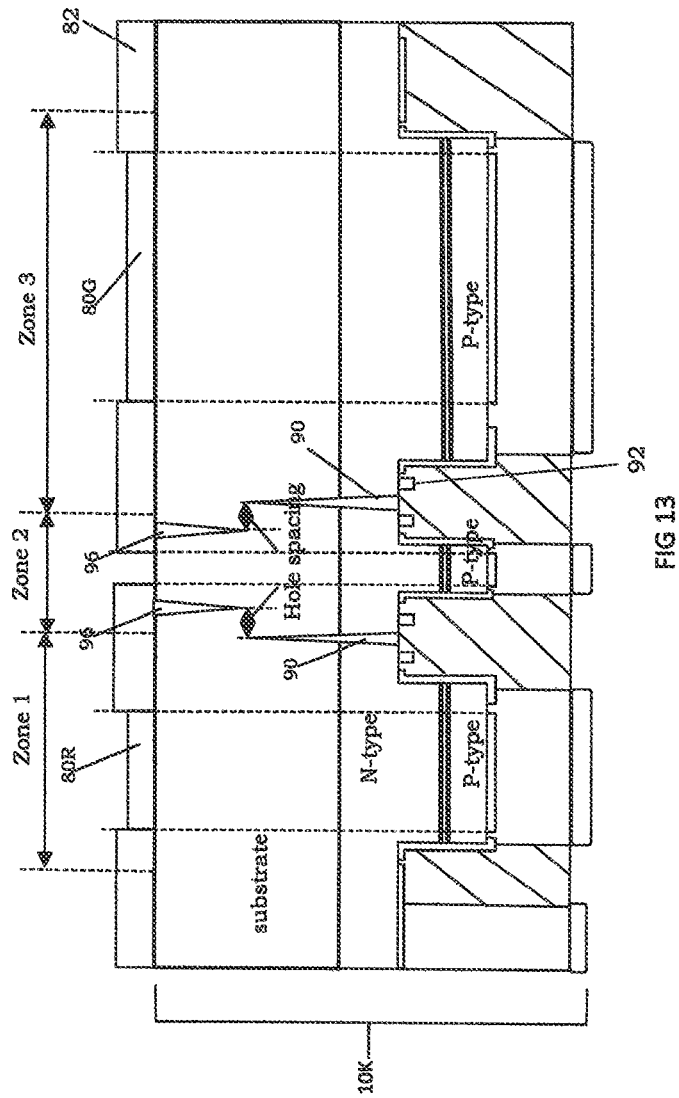
FIG. 13 is an enlarged schematic cross section drawing with parts removed of an eleventh single light emitting diode (LED) structure.

Referring to FIG. 13, an eleventh type of single light emitting diode (LED) structure 10K is illustrated. The eleventh type of single light emitting diode (LED) structure 10K is substantially the same as the single light emitting diode (LED) 10J shown in FIG. 12. In the eleventh type of single light emitting diode (LED) structure 10K, the top oblique light shielding holes 96 are located inside the bottom oblique light shielding holes 90 to enhance optical output.

Figure 14:
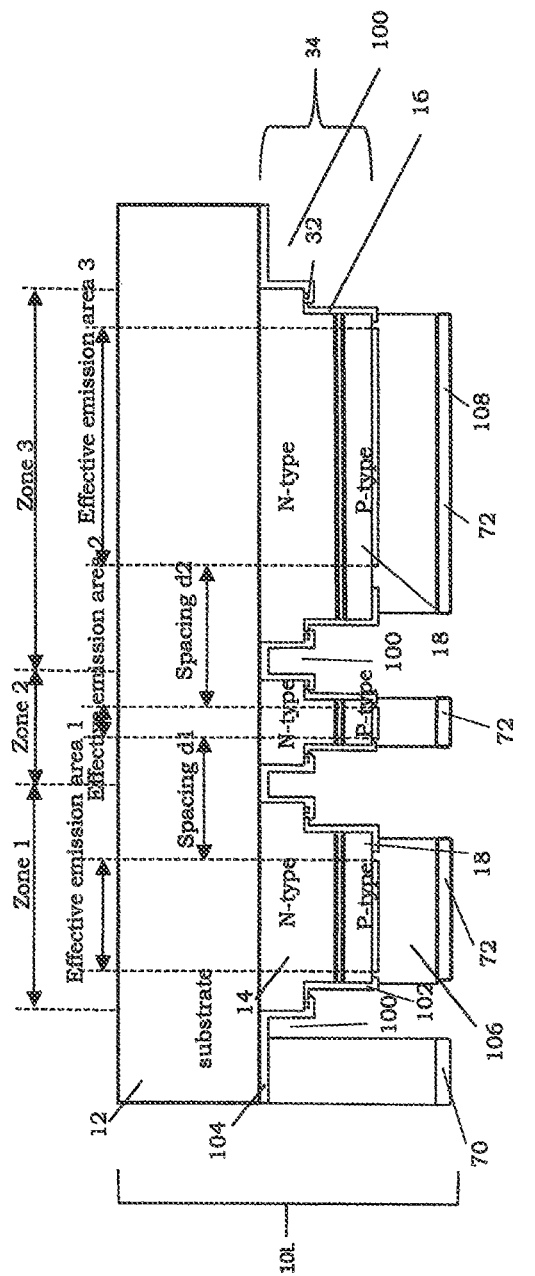
FIG. 14 is an enlarged schematic cross section drawing with parts removed of a twelfth single light emitting diode (LED) structure.

Referring to FIG. 14, a twelfth type of single light emitting diode (LED) structure 10L is illustrated. The twelfth type of single light emitting diode (LED) structure 10L is substantially the same as the single light emitting diode (LED) 10 shown in FIG. 1, but grooves 100 are formed in the n-type layer 14 to further isolate each zone from an adjacent zone. In addition, an isolation layer 102 can be formed on a portion of the p-type layer 18, on the etched sidewalls of the grooves 100, and on a portion of the n-type layer 14. A common reflective metal layer 104 can be formed on the p-type layer 18 to provide an electrical contact and reflect the light back to each zone to enhance the optical output. The common reflective metal layer 104 can also be configured as a common cathode and can also cover the exposed substrate 12 and a portion of the n-type layer 14. The common reflective metal layer 104 can be formed as a finger shape, a mesh shape or any suitable shape to provide an electrically conductive N metal electrode layer. A P-metal electrode layer 106 can then be formed to the epitaxial structure 34 in each zone and configured as an anode. A connecting layer 108 can also be formed on the P-metal electrode layer 106.

Figure 15:
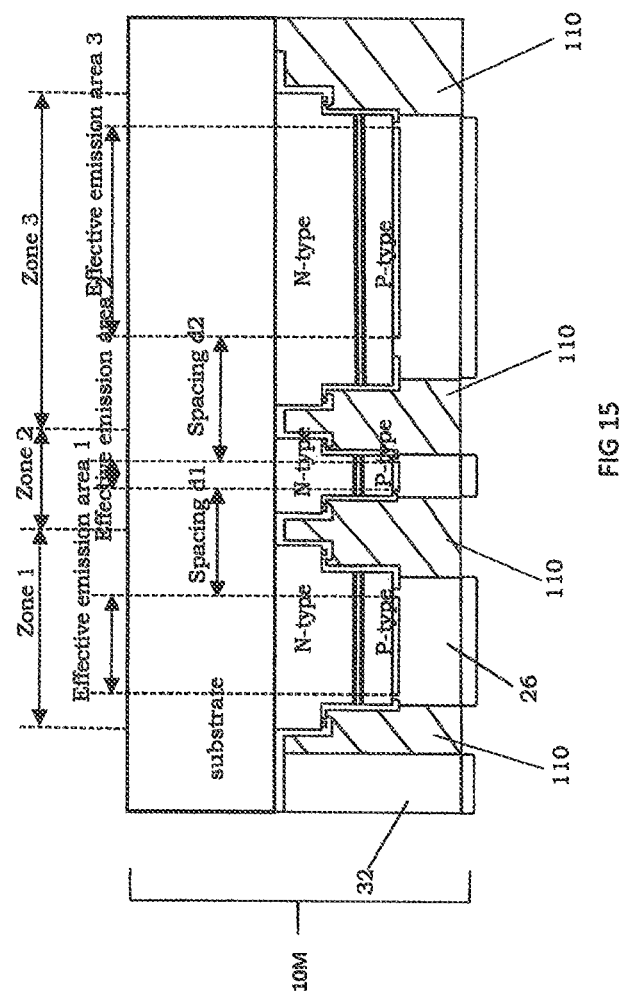
FIG. 15 is an enlarged schematic cross section drawing with parts removed of a thirteenth single light emitting diode (LED) structure.

Referring to FIG. 15, a thirteenth type of single light emitting diode (LED) structure 10M is illustrated. The thirteenth type of single light emitting diode (LED) structure 10M is substantially the same as the twelfth single light emitting diode (LED) structure 10L but includes an isolation material 110 formed between the N metal electrode layers 32 and the P-metal electrode layers 26 to enhance the single LEDF integrity. The isolation material 110 can also be planarized together with the P-metal electrode layers 26 and the N metal electrode layers 32 to be a substantial at the same plane.

Figure 16:
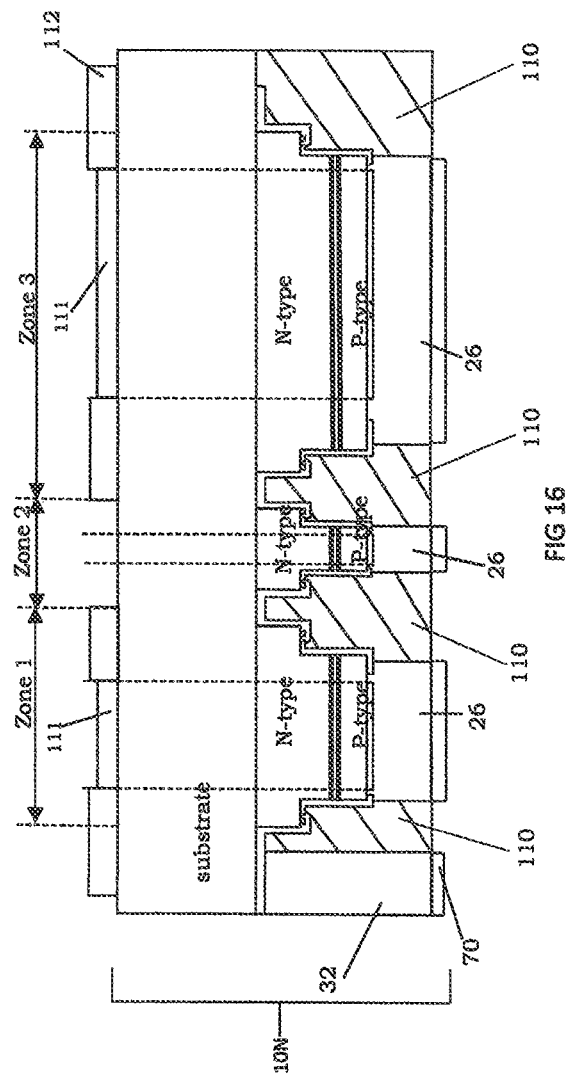
FIG. 16 is an enlarged schematic cross section drawing with parts removed of a fourteenth single light emitting diode (LED) structure.

Referring to FIG. 16, a fourteenth type of single light emitting diode (LED) structure 10N is illustrated. The fourteenth type of single light emitting diode (LED) structure 10N is substantially the same as the thirteenth single light emitting diode (LED) structure 10M but includes wave length conversion members 111 and a dam 112 constructed as previously described for the seventh single light emitting diode (LED) structure 10F shown in FIG. 7.

Figure 17:
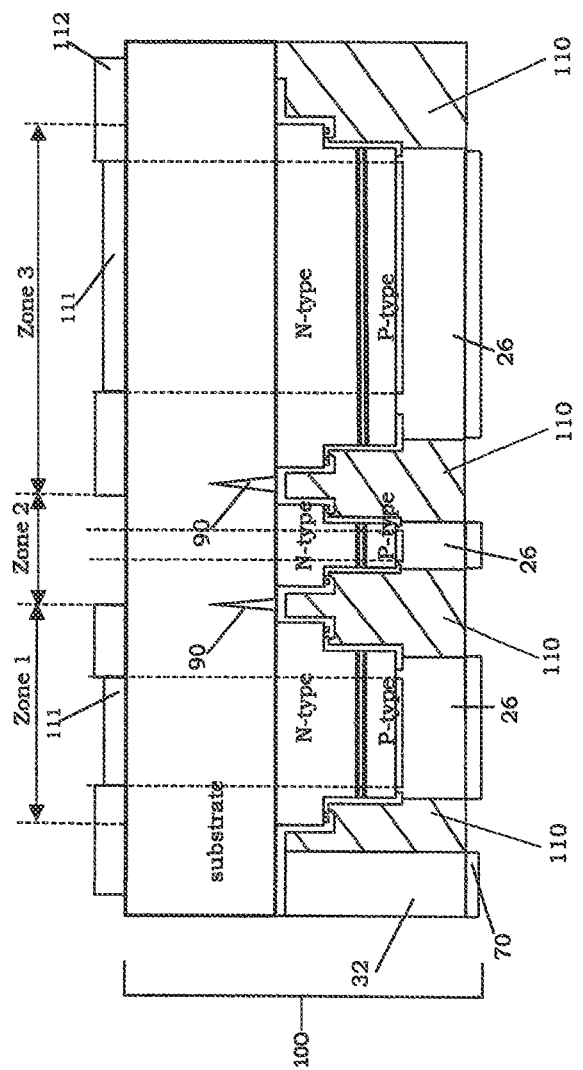
FIG. 17 is an enlarged schematic cross section drawing with parts removed of a fifteenth single light emitting diode (LED) structure.

Referring to FIG. 17, a fifteenth type of single light emitting diode (LED) structure 10O is illustrated. The fifteenth type of single light emitting diode (LED) structure 10O is substantially the same as the fourteenth single light emitting diode (LED) structure 10N but includes oblique light shielding holes 90 constructed as previously described for the ninth single light emitting diode (LED) structure 10I shown in FIG. 11 to enhance optical output.

Referring to FIG. 18, a sixteenth type of single light emitting diode (LED) structure 10P is illustrated. The sixteenth type of single light emitting diode (LED) structure 10P is substantially the same as the fifteenth single light emitting diode (LED) structure 10O but includes oblique light shielding holes 96 constructed as previously described for the tenth single light emitting diode (LED) structure 10J shown in FIG. 12.

Referring to FIG. 19, a nineteenth type of single light emitting diode (LED) structure 10Q is illustrated. The nineteenth type of single light emitting diode (LED) structure 10Q is substantially the same as the sixteenth single light emitting diode (LED) structure 10P but includes oblique light shielding holes 96 located inside the oblique light shielding holes 90 as previously described for the eleventh type of single light emitting diode (LED) structure 10K shown in FIG. 13 to enhance optical output.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

We claim:

1. A single light emitting diode (LED) structure comprising:
   a substrate;
   an array of spaced discrete light emitting zones on the substrate separated by isolation areas, each emitting zone comprising a separate portion of a single epitaxial structure comprising an n-type layer, a p-type layer, and an active layer configured to emit an emitting light having a particular wavelength over an effective emission area, with the effective emission area for each emitting zone geometrically defined and electrically configured to provide a desired light intensity for each emitting zone, each emitting zone having a wavelength conversion member on the effective emission area configured to convert an emitting wavelength to a different color for each emitting zone;
   an n-type metal layer in electrical communication with the n-type layer; and
   a p-type metal layer in electrical communication with the p-type layer,
   the n-type metal layer and the p-type metal layer configuring each emitting zone as a discrete, controllable light emitting unit.

2. The single light emitting diode (LED) structure of claim 1 wherein the light emitting zones include a first zone configured to emit a green light, a second zone configured to emit a blue light and a third zone configured to emit a red light.

3. The single light emitting diode (LED) structure of claim 1 wherein the effective emission area for each zone is spaced from an adjacent effective emission area by a distance (d1) selected to reduce a cross talk effect between the light emitting zones.

4. The single light emitting diode (LED) structure of claim 1 further comprising an oblique light shielding hole in the substrate configured to provide a light stop structure for preventing the scattering of the emitting light.

5. The single light emitting diode (LED) structure of claim 1 wherein the isolation areas comprise an insulating material.

6. The single light emitting diode (LED) structure of claim 1 further comprising at least one color filter layer formed on at least one emitting zone.

7. The single light emitting diode (LED) structure of claim 1 further comprising at least one dam member formed above at least a portion of at least one emitting zone.

8. The single light emitting diode (LED) structure of claim 1 wherein the effective emission area for each zone is different.

9. The single light emitting diode (LED) structure of claim 1 wherein the single epitaxial structure comprises a chip formed using semiconductor fabrication processes.

10. A single light emitting diode (LED) structure comprising:
    a substrate;
    a plurality of controllable, electrically separated emitting zones on the substrate, with each emitting zone comprising a separate portion of a single epitaxial structure comprising an n-type layer, a p-type layer, and an active layer configured to emit an emitting light having a particular wavelength over an effective emission area, with the effective emission area for each emitting zone geometrically defined and electrically configured to provide a desired light intensity for each emitting zone, each emitting zone having a wavelength conversion member on the effective emission area configured to convert an emitting wavelength of the emitting light to a different color for each emitting zone to produce a desired spectra or design, and with the effective emission area for each zone spaced from an adjacent effective emission area by a distance (d1) selected to reduce a cross talk effect between the light emitting from adjacent zones; and
    a reflective metal layer on the substrate configured as a common cathode for each epitaxial structure for configuring each emitting zone as a discrete, controllable light emitting unit.

11. The single light emitting diode (LED) structure of claim 10 further comprising one or more color filter layers in selected emission zones.

12. The single light emitting diode (LED) structure of claim 10 wherein the emitting zones are electrically separated by an insulation material.

13. The single light emitting diode (LED) structure of claim 10 further comprising a plurality of oblique light shielding holes in the substrate configured to provide light stop structures.

14. The single light emitting diode (LED) structure of claim 13 wherein the oblique light shielding holes comprise spaced holes in a back side of the substrate.

15. The single light emitting diode (LED) structure of claim 13 wherein the oblique light shielding holes comprise spaced holes in a front side of the substrate.

16. A single light emitting diode (LED) structure comprising:
    a substrate;
    a plurality of controllable, electrically separated light emitting zones on the substrate having multiple emission zones, each emission zone comprising a separate portion of a single epitaxial structure comprising an n-type layer, a p-type layer, and an active layer configured to emit an emitting light having a particular wavelength over an effective emission area, with the effective emission area for each emitting zone geometrically defined and electrically configured to provide a desired light intensity for each emitting zone, each emitting zone having a wavelength conversion member on the effective emission area configured to convert an emitting wavelength to a different color for each emitting zone to produce a desired spectra or design, with an effective emission area for each emission zone spaced from an adjacent effective emission area by a distance (d1) selected to reduce a cross talk effect between the light emitting zones; and a reflective metal layer on the substrate configured as a common cathode in electrical communication with the light emitting zones for configuring each emitting zone as a discrete, controllable light emitting unit.

17. The single light emitting diode (LED) structure of claim 16 wherein the emitting zones are electrically separated by an insulation material.

18. The single light emitting diode (LED) structure of claim 16 further comprising a plurality of oblique light shielding holes in the substrate configured to provide light stop structures.

* * * * *